United States Patent
Kitada

(10) Patent No.: US 10,734,570 B2
(45) Date of Patent: Aug. 4, 2020

(54) PIEZOELECTRIC ELEMENT AND PIEZOELECTRIC ELEMENT APPLIED DEVICE

(71) Applicant: SEIKO EPSON CORPORATION, Tokyo (JP)

(72) Inventor: Kazuya Kitada, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 363 days.

(21) Appl. No.: 15/915,649

(22) Filed: Mar. 8, 2018

(65) Prior Publication Data
US 2018/0277741 A1 Sep. 27, 2018

(30) Foreign Application Priority Data
Mar. 22, 2017 (JP) ................. 2017-056483

(51) Int. Cl.
*H01L 41/187* (2006.01)
*B41J 2/16* (2006.01)
(Continued)

(52) U.S. Cl.
CPC ...... *H01L 41/1871* (2013.01); *B41J 2/14233* (2013.01); *B41J 2/161* (2013.01);
(Continued)

(58) Field of Classification Search
CPC ............ H01L 41/1873; H01L 41/077; H01L 41/0805; H01L 41/0815
See application file for complete search history.

(56) References Cited

U.S. PATENT DOCUMENTS 10,181,555 B2 * 1/2019 Kitada ............... H01L 41/0805
2013/0106242 A1 5/2013 Shibata et al.
(Continued)

FOREIGN PATENT DOCUMENTS

| JP | 2012-19050 A | 1/2012 |
| JP | 2013-225605 A | 10/2013 |
| JP | 2014-65317 A | 4/2014 |

OTHER PUBLICATIONS

Wang et al. "Structures, electrical properties, and leakage current behaviors of un-doped and Mn-doped lead-free ferroeletric K0.5Na0.5NbO3 films" Journal of Applied Physics, vol. 115, No. 3. 034103, Jan. 15, 2014, pp. 034103-1 to 034103-7.*

(Continued)

*Primary Examiner* — C Melissa Koslow
(74) *Attorney, Agent, or Firm* — Workman Nydegger

(57) ABSTRACT

A piezoelectric element includes a first electrode, a second electrode, and a piezoelectric layer. The piezoelectric layer is provided between the first electrode and the second electrode, and is formed of a perovskite type oxide which contains potassium, sodium, niobium, and manganese. In the piezoelectric layer, a proportion of an A-site constituent element of the perovskite type oxide is smaller than a proportion of a B-site constituent element thereof. In XRD measurement of the piezoelectric layer, two or more peaks derived from the perovskite type oxide are provided in a range of $44°<2\theta<48°$, and an intensity ratio (X/Y) between a peak X having the highest intensity among the peaks, and a peak Y having the lowest intensity satisfies the following expression.

$2.0<(X/Y)$

14 Claims, 11 Drawing Sheets

(51) Int. Cl.
    *H01L 41/08*     (2006.01)
    *B41J 2/14*     (2006.01)
    *H01L 41/047*     (2006.01)
    *H01L 41/09*     (2006.01)
    *H01L 41/332*     (2013.01)
    *H01L 41/318*     (2013.01)

(52) U.S. Cl.
    CPC .......... *B41J 2/1623* (2013.01); *B41J 2/1628* (2013.01); *B41J 2/1629* (2013.01); *B41J 2/1646* (2013.01); *H01L 41/0477* (2013.01); *H01L 41/0805* (2013.01); *H01L 41/09* (2013.01); *H01L 41/1873* (2013.01); *H01L 41/332* (2013.01); *B41J 2002/14241* (2013.01); *B41J 2002/14419* (2013.01); *B41J 2202/03* (2013.01); *H01L 41/0973* (2013.01); *H01L 41/318* (2013.01)

(56) References Cited

U.S. PATENT DOCUMENTS

2016/0365503 A1      12/2016      Ikeuchi et al.
2017/0062697 A1      3/2017      Sakai et al.

OTHER PUBLICATIONS

Kaftelen et al. "Investigation of Mn-doped sodium-potassium niobate ((K,Na) Nb03) ceramics by EPR and impedance spectroscopic methods" Ferroelectrics, vol. 494, No. 1, Feb. 25, 2016, pp. 11-18.*

European Search Report issued in Application No. 18161817.4 dated Aug. 24, 2018.

Kaftelen et al. "Investigation of Mn-doped sodium-potassium niobate ( (K,Na) Nb03) ceramics by EPR and impedance spectroscopic methods" Ferroelectrics, vol. 494, No. 1, Feb. 25, 2016, pp. 11-18, XP055498369.

Kim et al. "Change of electrical properties of (K0.5Na0.5) (Mn0.005Nb0.995) 03 thin films induced by gamma-ray irradiation" Current Applied Physics, vol. 16, No. 5, Jan. 28, 2016, pp. 539-544, XP029474817.

Wang et al. "Structures, electrical properties, and leakage current behaviors of un-doped and Mn-doped lead-free ferroeletric K0.5Na0.5Nb03 films" Journal of Applied Physics, vol. 115, No. 3, 034103, Jan. 15, 2014, XP012180655.

* cited by examiner

EXAMPLE 1

EXAMPLE 2

PIEZOELECTRIC ELEMENT AND PIEZOELECTRIC ELEMENT APPLIED DEVICE

This application claims priority under 35 U.S.C. § 119 to Japanese Patent Application No. 2017-056483 filed on Mar. 22, 2017, the entire disclosure of which is expressly incorporated by reference herein.

BACKGROUND

1. Technical Field

The present invention relates to a piezoelectric element which includes a first electrode, a piezoelectric layer, and a second electrode, and a piezoelectric element applied device which includes the piezoelectric element.

2. Related Art

Generally, a piezoelectric element includes a piezoelectric layer and two electrodes. The piezoelectric layer has electromechanical conversion characteristics. The piezoelectric layer is interposed between the two electrodes. A device (piezoelectric element applied device) which uses such a piezoelectric element as a driving source has recently been actively developed. As one of the piezoelectric element applied devices, for example, a liquid ejecting head represented by an ink jet recording head, a MEMS element represented by a piezoelectric MEMS element, an ultrasonic measurement device represented by an ultrasonic sensor and the like, and a piezoelectric actuator device are provided.

As a material (piezoelectric material) of the piezoelectric layer of the piezoelectric element, lead zirconate titanate (PZT) is known. However, from a viewpoint of an environmental problem, a piezoelectric material which does not contain lead or a piezoelectric material in which the content of lead is suppressed has been required. As the piezoelectric material which does not contain lead, for example, a potassium sodium niobate (KNN)-based piezoelectric material which contains K, Na, and Nb is provided. The KNN-based material has a problem in that a leakage current is generated. However, a technology in which a rare-earth element is added as measures for securing the insulating property is proposed (see JP-A-2013-225605).

However, a problem that crystals are not oriented but randomly oriented, or heterogeneity appears occurs depending on the type or the amount of the additive. Thus, it is difficult to secure the insulating property while orientation is maintained without heterogeneity appearing.

Such a problem is not limited to a piezoelectric element used in a piezoelectric actuator which is mounted in a liquid ejecting head represented by an ink jet recording head, and similarly also occurs in a piezoelectric element used in other piezoelectric element applied devices.

SUMMARY

An advantage of some aspects of the invention is to provide a piezoelectric element and a piezoelectric element applied device which includes a KNN-based piezoelectric layer having an excellent insulating property.

According to an aspect of the invention, there is provided a piezoelectric element which includes a first electrode, a second electrode, and a piezoelectric layer. The piezoelectric layer is provided between the first electrode and the second electrode, and is formed of a perovskite type oxide which contains potassium, sodium, niobium, and manganese. In the piezoelectric layer, a proportion of an A-site constituent element of the perovskite type oxide is smaller than a proportion of a B-site constituent element thereof. In XRD measurement of the piezoelectric layer, two or more peaks derived from the perovskite type oxide are provided in a range of 44°<2θ<48°, and an intensity ratio (X/Y) between a peak X having the highest intensity among the peaks, and a peak Y having the lowest intensity satisfies the following expression.

$$2.0 < (X/Y)$$

In the aspect, the proportion of the A-site constituent element of the perovskite type oxide is smaller than the proportion of the B-site constituent element thereof, and, in XRD measurement of the piezoelectric layer, two or more peaks derived from the perovskite type oxide are provided in a range of 44°<2θ<48°, and the intensity ratio (X/Y) between a peak X having the highest intensity among the peaks, and a peak Y having the lowest intensity satisfies 2.0<(X/Y). Accordingly, the insulating property is improved without heterogeneity appearing.

Here, it is preferable that the perovskite type oxide constituting the piezoelectric layer is represented by the following formula. According to this configuration, a piezoelectric layer which has particularly excellent piezoelectric characteristics is obtained.

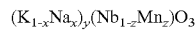

$$(K_{1-x}Na_x)_y(Nb_{1-z}Mn_z)O_3$$

(0.2≤x≤0.8, 0.9≤y<1, and 0.003≤z≤0.02)

It is preferable that, in the piezoelectric layer, crystals be oriented to {100} orientation. According to this configuration, it is possible to maintain the piezoelectric characteristics to be favorable.

It is preferable that, when a chemical bonding state of Nb is measured by XPS measurement, a Nb $3d_{3/2}$ peak of Nb>206.6 eV be satisfied. According to this configuration, a piezoelectric layer which has particularly excellent piezoelectric characteristics is obtained.

It is preferable that, when a chemical bonding state of Na is measured by XPS measurement, a Na 1s peak of Na<1071.7 eV be satisfied. According to this configuration, a piezoelectric layer which has particularly excellent piezoelectric characteristics is obtained.

The first electrode and the second electrode may be formed of at least one material selected from Pt, Ir, and oxides thereof. Accordingly, it is possible to realize a piezoelectric element having improved piezoelectric characteristics.

It is preferable that the piezoelectric element further include a layer which is formed of zirconium or zirconium oxide and is provided between a substrate on which the first electrode is provided, and the first electrode. According to this configuration, it is possible to prevent permeation of alkali metal into the substrate, and to realize a piezoelectric element having improved piezoelectric characteristics.

According to another aspect of the invention, there is provided a piezoelectric element applied device including the piezoelectric element.

In the aspect, it is possible to realize a piezoelectric element applied device which includes a KNN-based piezoelectric layer having an excellent insulating property.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
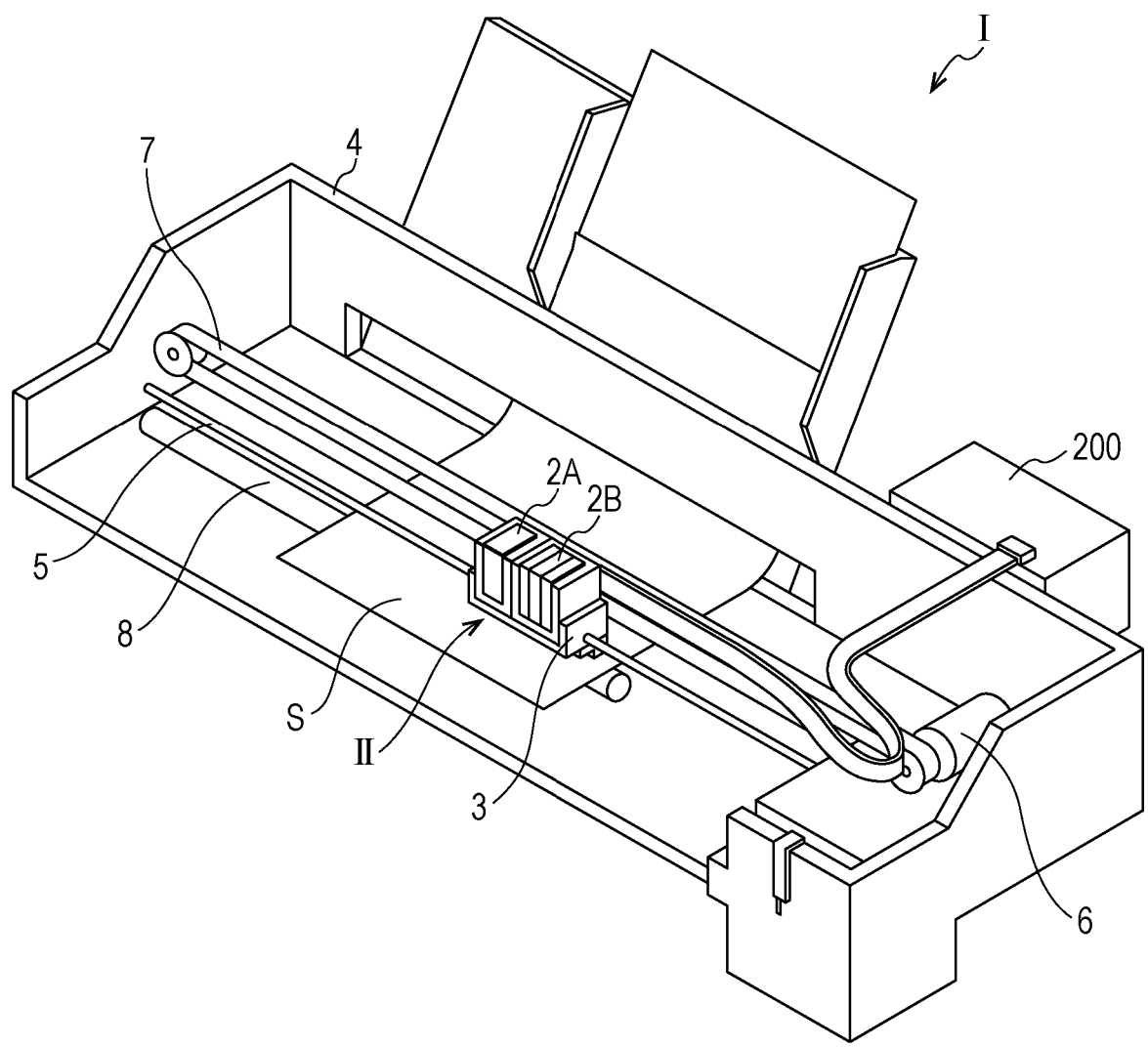
FIG. 1 is a diagram illustrating a schematic configuration of a recording apparatus.

Hereinafter, an embodiment according to the invention will be described with reference to the drawings. The following descriptions are used for describing an aspect of the invention, and may be arbitrarily changed in a range of the invention. In the drawings, components denoted by the same reference numerals indicate the same member as each other, and descriptions thereof will be appropriately omitted. In FIGS. 2 to 11, X, Y, and Z indicate three spatial axes perpendicular to each other. In the specification, descriptions will be made by using directions along the three spatial axes, which are respectively set as an X direction, a Y direction, and a Z direction. The Z direction indicates a thickness direction or a layered direction of a plate, a layer, and a film. The X direction and the Y direction indicate an in-plane direction of the plate, the layer, and the film.

Embodiment 1

FIG. 1 illustrates an ink jet type recording apparatus which is an example of a liquid ejecting apparatus. The liquid ejecting apparatus includes a recording head which is an example of a piezoelectric element applied device according to an embodiment of the invention. As illustrated in FIG. 1, in an ink jet type recording apparatus I, an ink jet recording head unit (head unit) II which includes a plurality of ink jet recording heads is provided so as to be attachable to cartridges 2A and 2B. The cartridges 2A and 2B constitute an ink supply section. A carriage 3 having the head unit II mounted therein is provided with a carriage shaft 5 so as to be movable in a shaft direction. The carriage shaft 5 is attached to a main body 4 of the apparatus. For example, the carriage 3 has a function of discharging a black ink composite and a color ink composite.

A driving force of a driving motor 6 is transferred to the carriage 3 through a plurality of gears and timing belts 7 (not illustrate). Thus, the carriage 3 having the head unit II mounted therein is moved along the carriage shaft 5. A transporting roller 8 is provided as a transporting section in the main body 4 of the apparatus. A recording sheet S which is a recording medium such as paper is transported by the transporting roller 8. The transporting section that transports the recording sheet S is not limited to the transporting roller, and may be a belt, a drum, or the like.

According to such an ink jet type recording apparatus I, since the ink jet type recording apparatus I includes the ink jet recording head (simply also referred to the "recording head" below), it is possible to manufacture the ink jet type recording apparatus I cheaply. Because improvement of displacement characteristics of the piezoelectric element constituting a piezoelectric actuator is expected, it is possible to improve ejecting characteristics.

Figure 2:
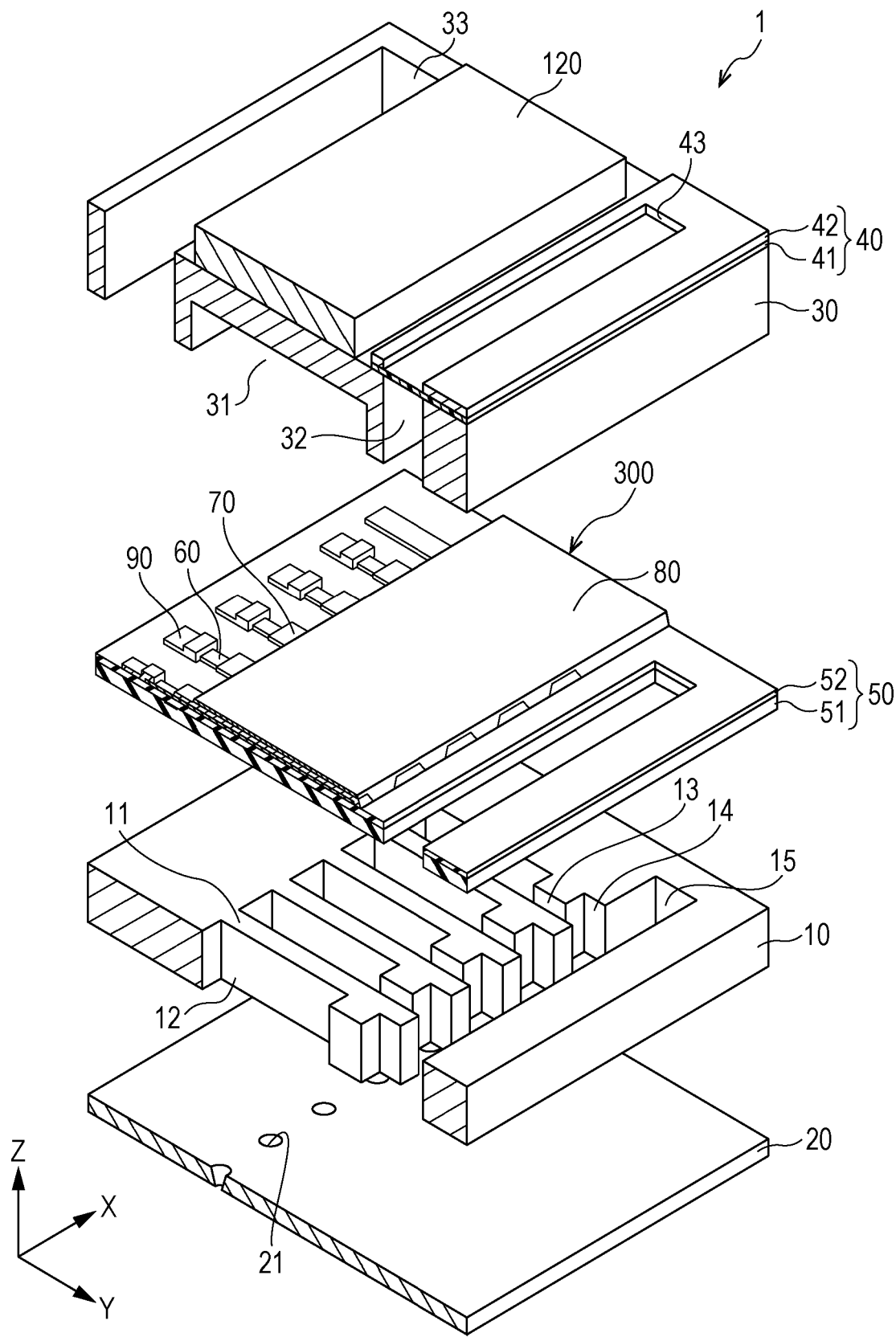
FIG. 2 is an exploded perspective view illustrating a recording head.
Figure 3:
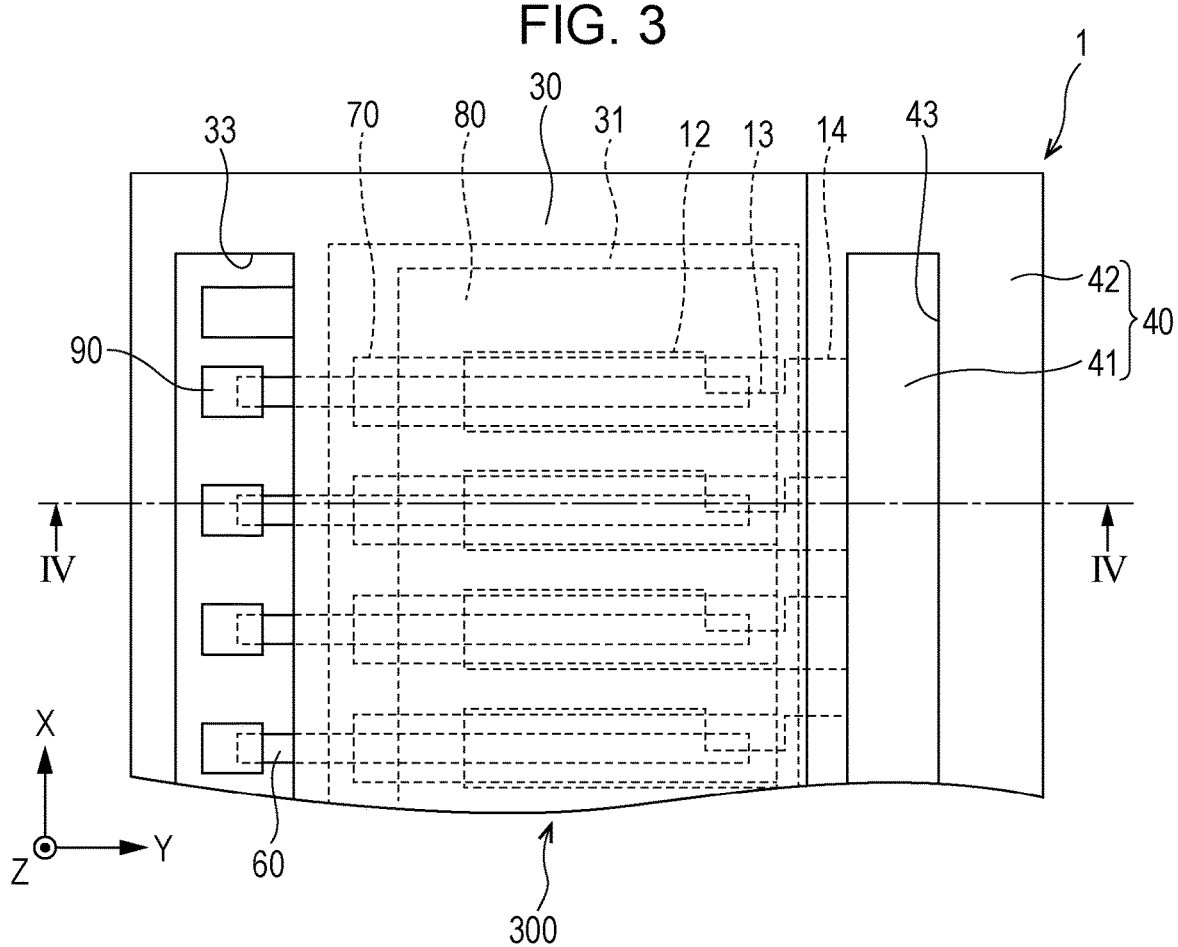
FIG. 3 is a plan view illustrating the recording head.
Figure 4:
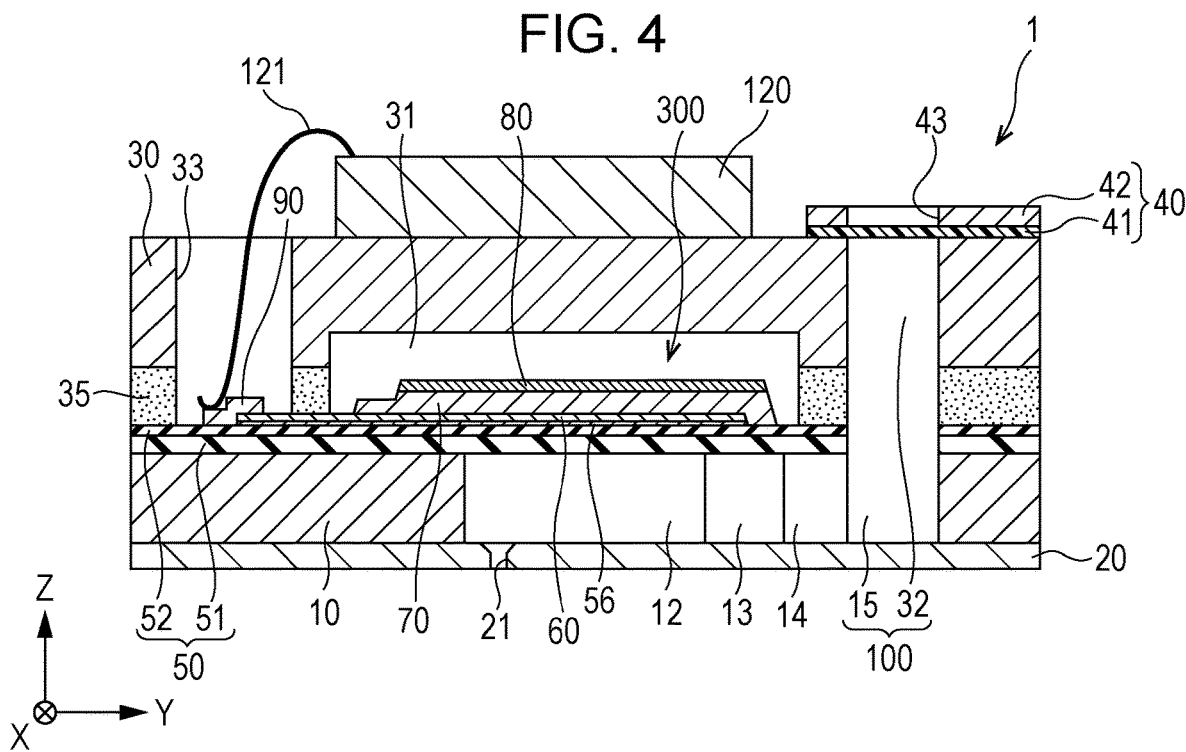
FIG. 4 is a cross-sectional view illustrating the recording head.

An example of a recording head 1 mounted in the above-described ink jet type recording apparatus I will be described with reference to FIGS. 2 to 4. FIG. 2 is an exploded perspective view illustrating the recording head which is an example of a liquid ejecting unit according to the embodiment. FIG. 3 is a plan view of a piezoelectric element side of a passage formation substrate. FIG. 4 is a cross-sectional view taken along line IVA-IVA in FIG. 3.

The passage formation substrate 10 (referred to as a "substrate 10") is formed from, for example, a silicon single crystal substrate. In the passage formation substrate 10, pressure generation chambers 12 are formed. In each of the pressure generation chambers 12 obtained by subdivision with a plurality of partitions 11, a plurality of nozzle openings 21 for discharging an ink of the same color are arranged in the X direction.

In the substrate 10, an ink supply path 13 and a communication path 14 are formed on one end portion side of the pressure generation chamber 12 in the Y direction. The ink supply path 13 is configured in such a manner that one side of the pressure generation chamber 12 is narrowed from the X direction and thus an opening area of the pressure generation chamber 12 becomes small. The communication path 14 has substantially the same width as the pressure generation chamber 12 in the X direction. A communication portion 15 is formed on the outside (+Y direction side) of the communication path 14. The communication portion 15 constitutes a portion of a manifold 100. The manifold 100 functions as a common ink chamber for the pressure generation chambers 12. In this manner, a fluid passage which is formed from the pressure generation chamber 12, the ink supply path 13, the communication path 14, and the communication portion 15 is formed in the substrate 10.

For example, a SUS nozzle plate 20 is bonded to one surface (surface on a −Z direction side) of the substrate 10. The nozzle openings 21 are arranged in the nozzle plate 20 in the X direction. The nozzle openings 21 respectively communicate with the pressure generation chambers 12. The nozzle plate 20 may be bonded to the substrate 10 by using an adhesive, a heat-welding film, or the like.

A vibration plate 50 is formed on another surface (surface on a +Z direction) of the substrate 10. The vibration plate 50 includes, for example, an elastic film 51 formed on the substrate 10, and an insulating film 52 formed on the elastic film 51. The elastic film 51 is formed of silicon dioxide ($SiO_2$), for example. The insulating film 52 is formed of zirconium dioxide ($ZrO_2$), for example. The elastic film 51 may not be a member separate from the substrate 10. A portion of the substrate 10 is processed so as to be thin, and a part obtained by the processing may be used as the elastic film.

A piezoelectric element 300 which includes a first electrode 60, a piezoelectric layer 70, and a second electrode 80 is formed on the insulating film 52 with an adhesive layer 56 interposed between the piezoelectric element 300. The adhesive layer 56 is used for improving adhesiveness between the first electrode 60 and the substrate. The adhesive layer 56 may be formed by using, for example, titanium oxide ($TiO_X$), titanium (Ti), silicon nitride (SiN), or the like. The adhesive layer 56 may be omitted. An orientation control layer (also referred to as a seed layer) for controlling an orientation of the piezoelectric layer 70 may be provided on the adhesive layer 56 or in a configuration in which the adhesive layer 56 is omitted.

In the embodiment, displacement of the piezoelectric layer 70 having electromechanical conversion characteristics causes displacement to occur in the vibration plate 50 and the first electrode 60. That is, in the embodiment, the vibration plate 50 and the first electrode 60 substantially have a function as a vibration plate. The elastic film 51 and the insulating film 52 may be omitted and only the first electrode 60 may function as the vibration plate. In a case where the first electrode 60 is directly provided on the substrate 10, the first electrode 60 is preferably protected by using an insulating protective film and the like, so as not to bring an ink into contact with the first electrode 60.

The piezoelectric layer 70 is provided between the first electrode 60 and the second electrode 80. The piezoelectric layer 70 is formed so as to have a width wider than the first electrode 60 in the X direction. The piezoelectric layer 70 in the Y direction is formed so as to have a width wider than the length of the pressure generation chamber 12 in the Y direction. An end portion (end portion in the +Y direction) of the ink supply path 13 side of the piezoelectric layer 70 in the Y direction is formed over the outside of an end portion of the first electrode 60. That is, another end portion (end portion on the +Y direction side) of the first electrode 60 is covered with the piezoelectric layer 70. One end portion (end portion on a −Y direction side) of the piezoelectric layer 70 is provided on the inner side of one end portion (end portion on the −Y direction side) of the first electrode 60. That is, the one end portion (end portion on the −Y direction side) of the first electrode 60 is not covered with the piezoelectric layer 70.

The second electrode 80 is provided over the piezoelectric layer 70, the first electrode 60, and the vibration plate 50 in the X direction. That is, the second electrode 80 is configured as a common electrode which is commonly used for a plurality of piezoelectric layers 70. Instead of the second electrode 80, the first electrode 60 may be used as the common electrode.

A protective substrate 30 is bonded to the substrate 10 in which the piezoelectric element 300 is formed, by using an adhesive 35. The protective substrate 30 includes a manifold portion 32. At least a portion of the manifold 100 is configured by the manifold portion 32. The manifold portion 32 according to the embodiment is formed in a width direction (X direction) of the pressure generation chamber 12, so as to pass through the protective substrate 30 in a thickness direction (Z direction). As described above, the manifold portion 32 communicates with the communication portion 15 of the substrate 10. With the configuration, the manifold 100 which functions as the common ink chamber for the pressure generation chambers 12 is configured.

A piezoelectric element holding portion 31 is formed in an area including the piezoelectric element 300 in the protective substrate 30. The piezoelectric element holding portion 31 has a space which is large enough not to impede the movement of the piezoelectric element 300. The space may be sealed or may not be sealed. A through-hole 33 which passes through the protective substrate 30 in the thickness direction (Z direction) is provided in the protective substrate 30. An end portion of the lead electrode 90 is exposed in the through-hole 33.

A driving circuit 120 which functions as a signal processing unit is fixed to the protective substrate 30. The driving circuit 120 may use, for example, a circuit board or a semiconductor integrated circuit (IC). The driving circuit 120 and the lead electrode 90 are electrically connected to each other through a connection wire 121. The driving circuit 120 may be electrically connected to a printer controller 200. Such a driving circuit 120 functions as a control section according to the embodiment.

A compliance substrate 40 which is formed from a sealing film 41 and a fixation plate 42 is bonded to the protective substrate 30. An area of the fixation plate 42, which faces the manifold 100, functions as an opening portion 43 obtained by completely removing the fixation plate 42 in the thickness direction (Z direction). One surface (surface on the +Z direction side) of the manifold 100 is sealed only by the sealing film 41 having flexibility.

Next, details of the piezoelectric element 300 will be described. The piezoelectric element 300 includes the first electrode 60, the second electrode 80, and the piezoelectric layer 70 provided between the first electrode 60 and the second electrode 80. The thickness of the first electrode 60 is about 50 nm. The piezoelectric layer 70 is a so-called thin-film piezoelectric body. That is, the piezoelectric layer 70 has a thickness of 50 nm to 2000 nm. The thickness of the second electrode 80 is about 50 nm. The value of the thickness of the constituents exemplified herein is only an example, and may be changed in a range without deviating from the gist of the invention.

As the material of the first electrode 60 and the second electrode 80, precious metal such as platinum (Pt) and iridium (Ir) or oxides thereof are suitable. The material of the first electrode 60 and the material of the second electrode 80 may be materials having conductivity. The material of the first electrode 60 and the material of the second electrode 80 may be the same as each other, or may be different from each other.

The piezoelectric layer 70 is formed by a thin film as described above, and is formed by a solution method (also referred to as a liquid phase method or a wet type method) such as a MOD method and a sol-gel method, or by a vapor phase method such as a sputtering method. In the embodiment, the piezoelectric layer 70 is formed by using a solution method, and is formed of a perovskite type oxide. The perovskite type oxide is indicated by a general formula $ABO_3$, and contains potassium (K), sodium (Na), niobium (Nb), and manganese (Mn).

In the perovskite type oxide of the piezoelectric layer 70, the proportion of an A-site constituent element is smaller than the proportion of a B-site constituent element. In XRD measurement of the piezoelectric layer 70, two or more peaks derived from the KNN are provided in a range of $44° < 2\theta < 48°$. An intensity ratio (X/Y) between a peak X having the highest intensity among the peaks, and a peak Y having the lowest intensity satisfies 2.0<(X/Y).

The A site is set to lack alkali metal, and in the XRD measurement, two or more peaks derived from the perovskite type oxide are provided in a range of 44°<2θ<48°. In addition, the intensity ratio (X/Y) between a peak X having the highest intensity among the peaks, and a peak Y having the lowest intensity satisfies 2.0<(X/Y). Accordingly, an effect in that the piezoelectric layer 70 has a favorable insulating property without heterogeneity appearing is exhibited.

Details of XRD will be described later.

Here, preferably, the piezoelectric layer 70 is formed of a piezoelectric material formed of a KNN-based compound oxide which is represented by Formula (1).

$$(K_{1-x}Na_x)_y(Nb_{1-z}Mn_z)O_3 \quad (1)$$

(0.2≤x≤0.8, 0.9≤y<1, and 0.003≤z≤0.02)

The compound oxide represented by Formula (1) is a non-lead-based piezoelectric material in which the content of lead (Pb) and the like is suppressed. Thus, the compound oxide has excellent biocompatibility and has a small environmental load. Because the KNN-based compound oxide has excellent piezoelectric characteristics among non-lead-based piezoelectric materials, the KNN-based compound oxide is advantageous for improving various types of characteristics. In addition, the KNN-based compound oxide has the Curie temperature higher than that of other non-lead-based piezoelectric materials (for example, BNT-BKT-BT; [(Bi,Na)TiO$_3$]—[(Bi,K)TiO$_3$]—[BaTiO$_3$]), and occurrence of depolarization due to an increase of a temperature is also difficult. Thus, using at a high temperature is possible.

The piezoelectric material forming the piezoelectric layer 70 may be the KNN-based compound oxide, and is not limited to the composition represented by the formula (1). For example, another metal element (additive) may be included in an A site or a B site of potassium sodium niobate. Examples of such an additive include manganese (Mn), lithium (Li), barium (Ba), calcium (Ca), strontium (Sr), zirconium (Zr), titanium (Ti), bismuth (Bi), tantalum (Ta), antimony (Sb), iron (Fe), cobalt (Co), silver (Ag), magnesium (Mg), zinc (Zn), and copper (Cu).

One or more types of this additive may be included. Generally, the amount of the additive is equal to or smaller than 20%, preferably equal to or smaller than 15%, and more preferably equal to or smaller than 10%, with respect to the total amount of an element which functions as the main component. Using the additive causes various types of characteristics to be improved, and thus configurations or functions are easily diversified. However, a piezoelectric material in which KNN is provided so as to be more than 80% is preferable from a viewpoint of showing characteristics which are derived from KNN. In a case where there is a compound oxide containing the above-described other elements, it is preferable that the ABO$_3$ type perovskite structure be also provided.

Here, in Formula (1), 0.2≤x≤0.8, 0.9≤y<1, and 0.003≤z≤0.02 are satisfied, and 0.3≤x≤0.7, 0.9≤y<1, and 0.003≤z≤0.01 are preferably satisfied. With such a composition, the piezoelectric layer 70 having improved piezoelectric characteristics is obtained.

In the specification, "a perovskite type compound oxide containing K, Na, Nb, and Mn" means "a compound oxide of the ABO$_3$ type perovskite structure containing K, Na, Nb, and Mn", and this is not limited only to the compound oxide of the ABO$_3$ type perovskite structure containing K, Na, Nb, and Mn. That is, in the specification, the "perovskite type compound oxide containing K, Na, Nb, and Mn" includes a piezoelectric material which is represented as a mixed crystal which contains a compound oxide (for example, KNN-based compound oxide which is exemplified above) of the ABO$_3$ type perovskite structure containing K, Na, Nb, and Mn, and other compound oxides having the ABO$_3$ type perovskite structure.

In the scope of the invention, other compound oxides is not limited. However, as the other compound oxides, a non-lead-based piezoelectric material which does not contain lead (Pb) is preferable. As the other compound oxides, a non-lead-based piezoelectric material which does not contain lead (Pb) and bismuth (Bi) is more preferable. If the compound oxide is used, the piezoelectric element 300 having excellent biocompatibility, and has a small environmental load is obtained.

In the piezoelectric layer 70 formed of the above-described compound oxide, crystals are oriented to {100} orientation in the embodiment. That is, the crystals are preferentially oriented to the (100) crystal plane. Since the piezoelectric layer 70 formed from a KNN-based compound oxide is easily and naturally oriented to the (100) plane, the orientation control layer is not used. In addition, the piezoelectric layer 70 may also be preferentially oriented to the (110) plane or the (111) plane or may also be preferentially strongly oriented to the (100) plane, by a predetermined orientation control layer which is provided if necessary. The piezoelectric layer 70 which is preferentially oriented to the predetermined crystal plane causes various types of characteristics to be improved easier than a piezoelectric layer which is randomly oriented. In the embodiment, the crystals are preferentially oriented to the (100) plane, and preferential orientation to the (100) plane is preferable from a viewpoint of the piezoelectric characteristics. In the specification, preferential orientation means that a crystal of which the content is equal to or greater than 50%, and preferably equal to or greater than 80% is oriented to a predetermined crystal plane. For example, "being preferentially orientated in (100) plane" includes a case where all crystals in the piezoelectric layer 70 are oriented to the (100) plane, and a case where crystals of the half or more (being equal to or greater than 50%, and preferably equal to or greater than 80%) are oriented to the (100) plane.

Since the piezoelectric layer 70 is polycrystalline, stress in the plane is dispersed and becomes uniform. Thus, occurrence of breaking of the piezoelectric element 300 due to the stress is difficult, and reliability is improved.

Here, as described above, in the piezoelectric layer 70, in XRD measurement, two or more peaks derived from KNN are provided in a range of 44°<2θ<48°. The intensity ratio (X/Y) between a peak X having the highest intensity and a peak Y having the lowest intensity satisfies 2.0<(X/Y), and preferably satisfies 2.0<(X/Y)<10.0. Accordingly, the piezoelectric layer 70 which has high insulating characteristics without an occurrence of heterogeneity is obtained.

The phase of two or more peaks being provided includes a case where a broad peak formed by overlapping some peaks on each other is provided in addition to a clearly split peak. As described above, in a case where the broad peak is provided, but the clearly split peak is not provided, it is assumed that peak separation is performed, and thus comparison between separated peaks is performed.

When the chemical bonding state of Nb is measured by XPS measurement, it is preferable that (peak of Nb 3d$_{3/2}$ on a high energy side of Nb) >206.6 eV be satisfied. In the embodiment, such a state is obtained. This means that peak shift occurs by, for example, a bonding state with the surrounding elements.

When the chemical bonding state of Na is measured by XPS measurement, it is preferable that peak Na1s of Na<1071.7 eV be satisfied. In the embodiment, such a state is obtained. This means that peak shift occurs by, for example, a bonding state with the surrounding elements.

Figure 5:
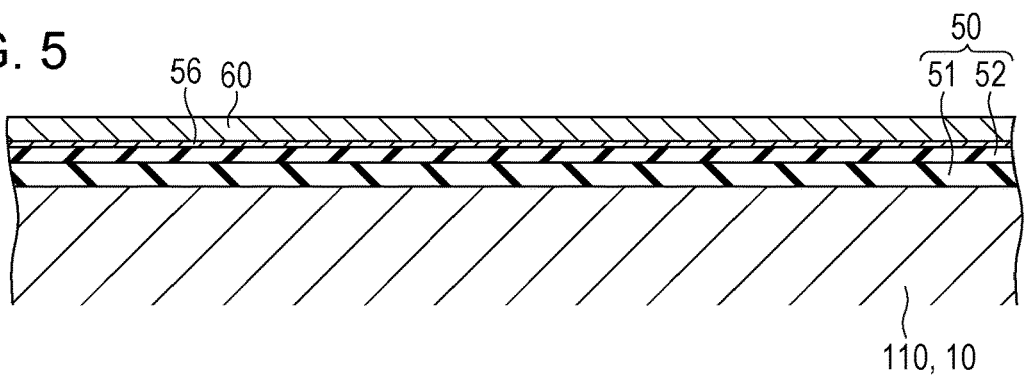
FIG. 5 is a sectional view illustrating a manufacturing example of the recording head.

Next, an example of a manufacturing method of a piezoelectric element 300 will be described with reference to FIGS. 5 to 11. The descriptions will be made with a manufacturing method of the ink jet recording head 1. Firstly, a silicon substrate (also referred to as "a wafer" below) 110 is prepared. Then, the silicon substrate 110 is thermally oxidized, and thus an elastic film 51 formed of silicon dioxide is formed on the silicon substrate 110. A zirconium film is formed on the elastic film 51 by sputtering, and the zirconium film is thermally oxidized. Thus, an insulating film 52 is formed. In this manner, a vibration plate 50 configured from the elastic film 51 and the insulating film 52 is obtained. Then, an adhesive layer 56 formed of titanium oxide is formed on the insulating film 52 by using a sputtering method or by thermally oxidizing a titanium film. Thus, as illustrated in FIG. 5, a first electrode 60 is formed on the adhesive layer 56 by using a sputtering method, an evaporation method, or the like.

Figure 6:
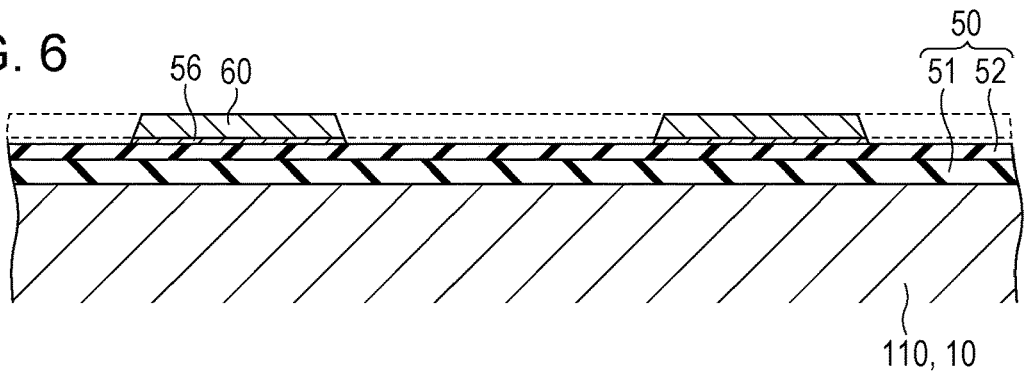
FIG. 6 is a sectional view illustrating the manufacturing example of the recording head.
Figure 7:
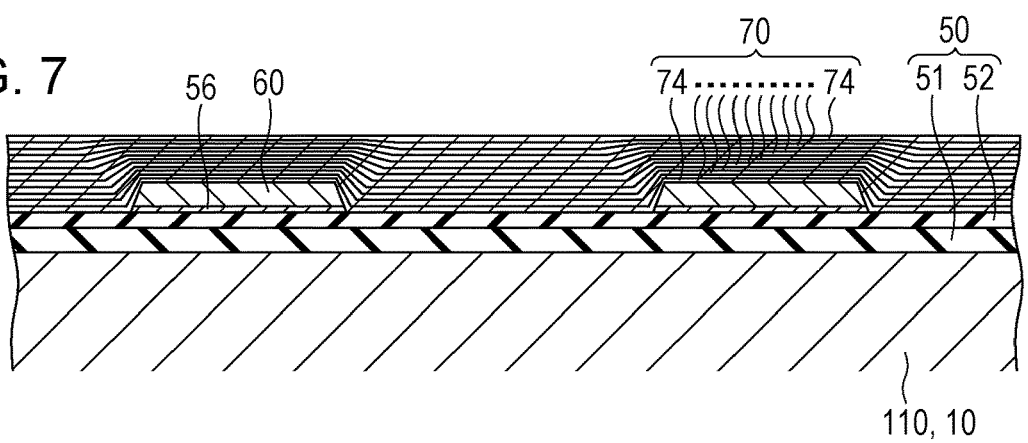
FIG. 7 is a sectional view illustrating the manufacturing example of the recording head.

Then, as illustrated in FIG. 6, a resist (not illustrated) having a predetermine shape is formed as a mask on the first electrode 60. The adhesive layer 56 and the first electrode 60 are simultaneously patterned. Then, as illustrated in FIG. 7, a plurality of piezoelectric films 74 are formed so as to be superposed on the adhesive layer 56, the first electrode 60, and the vibration plate 50. The piezoelectric layer 70 is formed by the plurality of piezoelectric films 74. The piezoelectric layer 70 may be formed by using a solution method (chemical solution method) such as a MOD method and a sol-gel method, for example. The piezoelectric layer 70 is formed by using such a solution method, and thus it is possible to improve the productivity of the piezoelectric layer 70. The piezoelectric layer 70 formed by using such a solution method is formed by repeating a series of processes a plurality of number of times. The series of processes includes processes from a process (coating process) of performing coating with a precursor solution to a process (baking process) of baking the precursor film.

Specific procedures in a case where the piezoelectric layer 70 is formed by using the solution method are as follows, for example. Firstly, a precursor solution containing a predetermined metal complex is prepared. In the precursor solution, a metal complex for forming compound oxide containing K, Na, and Nb by baking is dissolved or dispersed in an organic solvent by baking. At this time, a metal complex containing an additive such as Mn may be mixed.

Examples of the metal complex containing K include potassium 2-ethylhexanoate, and potassium acetate. Examples of the metal complex containing Na include sodium 2-ethylhexanoate, and sodium acetate. Examples of the metal complex containing Nb include 2-ethyl hexane acid niobium and pentaethoxy niobium. In a case where Mn is added as the additive, examples of the metal complex containing Mn include manganese 2-ethylhexanoate. At this time, two or more types of metal complex may be used together. For example, as the metal complex containing K, potassium 2-ethylhexanoate and potassium acetate may be used together. As a solvent, 2-n-butoxyethanol, n-octane, a solvent mixture of 2-n-butoxyethanol and n-octane, and the like are exemplified. The precursor solution may contain an additive agent for stabilizing dispersion of the metal complex containing K, Na, and Nb. As such an additive agent, 2-ethyl hexane acid and the like are exemplified.

The coating with the precursor solution is performed on the wafer 110 on which the vibration plate 50, the adhesive layer 56, and the first electrode 60 are formed, thereby a precursor film is formed (coating process). Then, the precursor film is heated to a predetermined temperature, for example, to a temperature of about 130° C. to 250° C., and is dried for a predetermined period (drying process). Then, the dried precursor film is heated to a predetermined temperature, for example, to a temperature of about 300° C. to 450° C., and is held for a predetermined period, and thereby being degreased (degreasing process). Finally, if the degreased precursor film is heated to a higher temperature, for example, to a temperature of 600° C. to 800° C., and is held at this temperature, and thereby being crystallized, a piezoelectric film 74 is completed (baking process). It is appropriate that a heating rate in the drying process is set to be 30° C./sec to 350° C./sec. The piezoelectric film 74 is baked at such a heating rate by using the solution method, and thus it is possible to realize the piezoelectric layer 70 which is not pseudo-cubic. The "heating rate" stated herein defines a time change rate of the temperature when the temperature reaches a desired baking temperature from 350° C.

As a heating device used in the drying process, the degreasing process, and the baking process, for example, a rapid thermal annealing (RTA) device, a hot plate, and the like are exemplified. The RTA device performs heating by irradiation with an infrared lamp. The above processes are repeated a plurality of number of times, and thus the piezoelectric layer 70 formed from a plurality of piezoelectric films 74 is formed. In the series of the processes from the coating process to the baking process, the processes from the coating process to the degreasing process may be repeated a plurality of number of times, and then, the baking process may be performed.

Before or after the second electrode 80 is formed on the piezoelectric layer 70, if necessary, re-heating treatment (post annealing) may be performed in a temperature range of 600° C. to 800° C. It is possible to form a good interface between the piezoelectric layer 70, and the first electrode or the second electrode 80, and to improve crystallinity of the piezoelectric layer 70, by performing such post annealing.

In the embodiment, the piezoelectric material contains alkali metal (K or Na). The alkali metal is easily diffused in the first electrode 60 or the adhesive layer 56, in the baking process. If the alkali metal reaches the wafer 110 through the first electrode 60 and the adhesive layer 56, the alkali metal is caused to react with the wafer 110. However, in the embodiment, the insulating film 52 formed from the zirconium oxide layer conducts the stopper function of K or Na. Thus, it is possible to suppress reaching of the alkali metal to the wafer 110 which is a silicon substrate.

Figure 8:
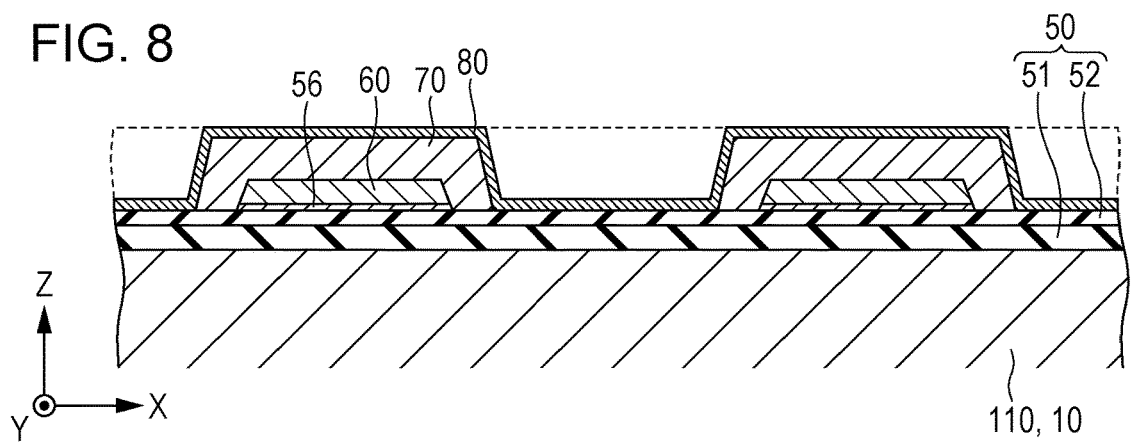
FIG. 8 is a sectional view illustrating the manufacturing example of the recording head.

After that, the piezoelectric layer 70 formed from a plurality of piezoelectric films 74 is patterned so as to have a shape as illustrated in FIG. 8. Patterning may be performed by using dry etching such as reactive ion etching and ion milling, or wet etching in which an etching liquid is used. Then, the second electrode 80 is formed on the piezoelectric layer 70. The second electrode 80 may be formed by using a method similarly to the first electrode 60. With the above processes, the piezoelectric element 300 which includes the first electrode 60, the piezoelectric layer 70, and the second electrode 80 is completed. In other words, a portion at which the first electrode 60, the piezoelectric layer 70, and the second electrode 80 overlap each other functions as the piezoelectric element 300.

A layer or a film formed by the solution method has an interface. Traces of coating or baking remains on the layer or the film formed by the solution method. Such a trace functions as "an interface" which can be confirmed by observing the section of the trace or by analyzing concentration distribution of an element in the layer (or in the film). The "interface" strictly means a boundary between layers or between films. However, here, it is assumed that the interface means the vicinity of a boundary between layers or between films. In a case where the section of a layer of a film formed by the solution method is observed by an electronic microscope or the like, such an interface is confirmed in the vicinity of a boundary with the adjacent layer or with the adjacent film, as a portion having a color darker than those of other portions, or as a portion having a color lighter than those of other portions. In a case where the concentration distribution of an element is analyzed, such an interface is confirmed in the vicinity of a boundary with the adjacent layer or with the adjacent film, as a portion at which the concentration of the element is higher than that at other portions, or as a portion at which the concentration of the element is lower than that at other portions. The piezoelectric layer 70 is formed in a manner that a series of processes from the coating process to the baking process are repeated a plurality of number of times, or in a manner that processes from the coating process to the degreasing process are repeated a plurality of number of times, and then the baking process is performed (configured by a plurality of piezoelectric films). Thus, the piezoelectric layer 70 has a plurality of interfaces for each piezoelectric film.

Figure 9:
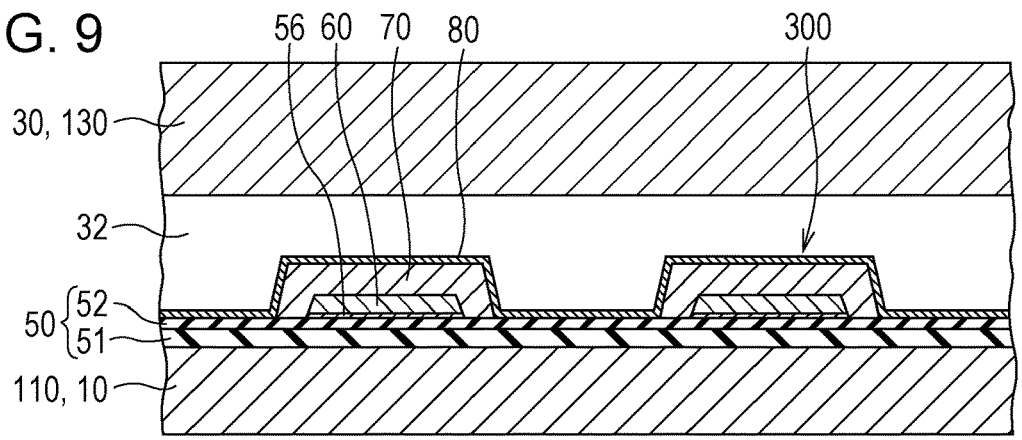
FIG. 9 is a sectional view illustrating the manufacturing example of the recording head.
Figure 10:
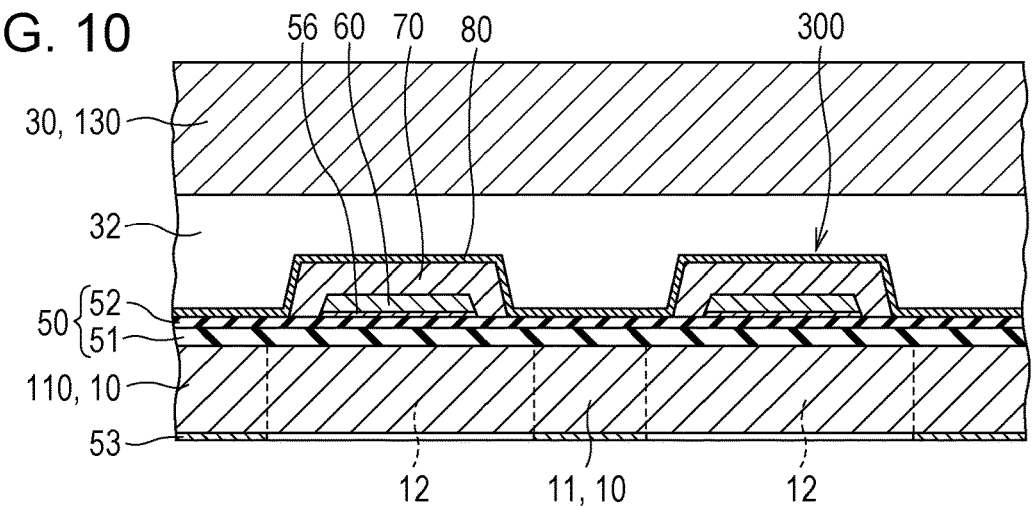
FIG. 10 is a sectional view illustrating the manufacturing example of the recording head.
Figure 11:
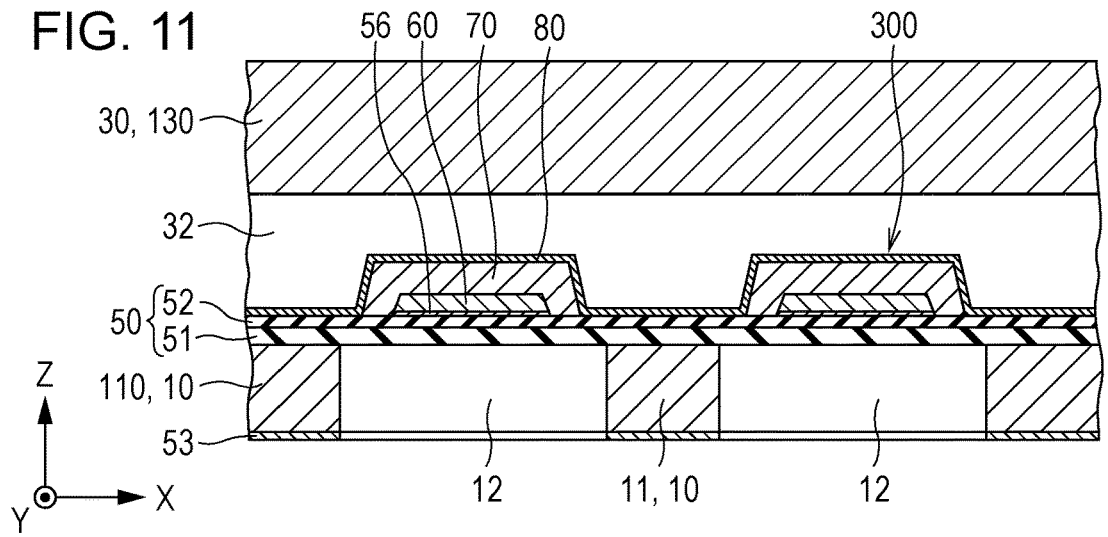
FIG. 11 is a sectional view illustrating the manufacturing example of the recording head.

Then, as illustrated in FIG. 9, a wafer 130 for the protective substrate is bonded to a surface on the piezoelectric element 300 side of the wafer 110, through the adhesive 35 (see FIG. 4). Then, the surface of the wafer 130 for the protective substrate is abraded so as to become thin. The manifold portion 32 or the through-hole 33 (see FIG. 4) is formed on the wafer 130 for the protective substrate. Then, as illustrated in FIG. 10, a mask film 53 is formed on a surface of the wafer 110 on an opposite side of the piezoelectric element 300, and is patterned so as to have a predetermined shape. As illustrated in FIG. 11, anisotropic etching (wet etching) with an alkaline solution such as KOH is performed on the wafer 110 through the mask film 53. Thus, the ink supply path 13, the communication path 14, and the communication portion 15 (see FIG. 4) are formed in addition to the pressure generation chamber 12 corresponding to each piezoelectric element 300.

Then, an unnecessary portion of an outer circumferential portion of the wafer 110 and the wafer 130 for the protective substrate is cut out and removed by dicing and the like. The nozzle plate 20 is bonded to the surface of the wafer 110 on the opposite side of the piezoelectric element 300 (see FIG. 4). The compliance substrate 40 is bonded to the wafer 130 for the protective substrate (see FIG. 4). With the process until here, an assembly of chips for the ink jet recording head 1 is completed. The assembly is divided for each of the chips, and thus, the ink jet recording head 1 is obtained.

EXAMPLES

Examples of the invention will be described below.

Example 1

A surface of a silicon substrate of 6 inches, which was used as the passage formation substrate 10 was thermally oxidized, and thus the elastic film 51 formed of silicon dioxide was formed on the silicon substrate. Then, a zirconium film was formed on the elastic film 51 by sputtering, and the zirconium film was thermally oxidized. Thus, the insulating film 52 formed of zirconium oxide was formed. Then, a film was formed on the insulating film 52 by a sputtering method and thermal oxidization was performed so as to form an adhesive layer 56 formed of titanium oxide. After a platinum film was formed on the adhesive layer 56 by using a sputtering method, the platinum film was patterned so as to have a predetermined shape. Thus, the first electrode 60 having a thickness of 50 nm was formed.

Then, the piezoelectric layer 70 was formed by the following procedures. Firstly, mixing was performed so as to have a composition of $(K_{0.4}Na_{0.6})_{0.90}(Nb_{0.995}Mn_{0.005})O_3$, by using a solution which is formed of potassium 2-ethylhexanoate, sodium 2-ethyl hexanoate, niobium 2-ethylhexanoate, and manganese 2-ethylhexanoate. The mixture was applied onto the layer by the sputtering method (coating process). Then, the resultant was dried (drying process) at 180° C. and degreased (degreasing process) at 380° C. on a hot plate. A heating treatment was performed at 600° C. by using rapid thermal annealing (RTA) for three minutes (baking process). These processes from the coating process to the baking process were repeated 7 times. Thus, a KNN-based piezoelectric layer 70 having a film thickness of about 500 nm was manufactured.

A platinum film was formed on the piezoelectric layer 70 by a sputtering method while heating was performed up to 200° C., and thereby a second electrode 80 having a thickness of 100 nm was formed.

Then, in order to improve adhesiveness between the platinum film and the piezoelectric layer 70, re-heating (post annealing) was performed at 650° C. by the RTA device for three minutes. Thus, a piezoelectric element in Example 1 was formed.

Example 2

A piezoelectric layer was manufactured in a manner similar to that in Example 1 except that the composition of the piezoelectric layer was set to be $(K_{0.4}Na_{0.6})_{0.94}(Nb_{0.995}Mn_{0.005})O_3$.

Comparative Example 1

A piezoelectric layer was manufactured in a manner similar to that in Example 1 except that the composition of the piezoelectric layer was set to be $(K_{0.4}Na_{0.6})(Nb_{0.995}Mn_{0.005})O_3$.

Comparative Example 2

A piezoelectric layer was manufactured in a manner similar to that in Example 1 except that the composition of the piezoelectric layer was set to be $(K_{0.4}Na_{0.6})(Nb_{0.98}Mn_{0.02})O_3$.

Comparative Example 3

A piezoelectric layer was manufactured in a manner similar to that in Example 1 except that the composition of the piezoelectric layer was set to be $(K_{0.4}Na_{0.6})_{0.94}NbO_3$.

The following test was performed on the piezoelectric layer of the examples and the comparative examples which were described above. Table 1 shows results.

Hysteresis Measurement

Figure 12:
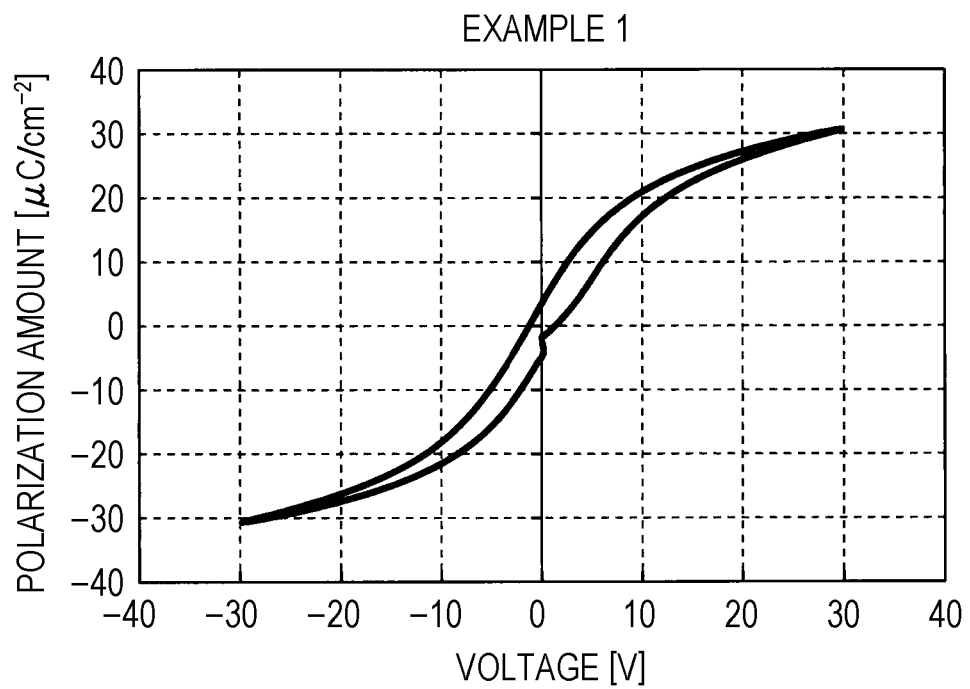
FIG. 12 is a diagram illustrating a hysteresis curve in Example 1.
Figure 13:
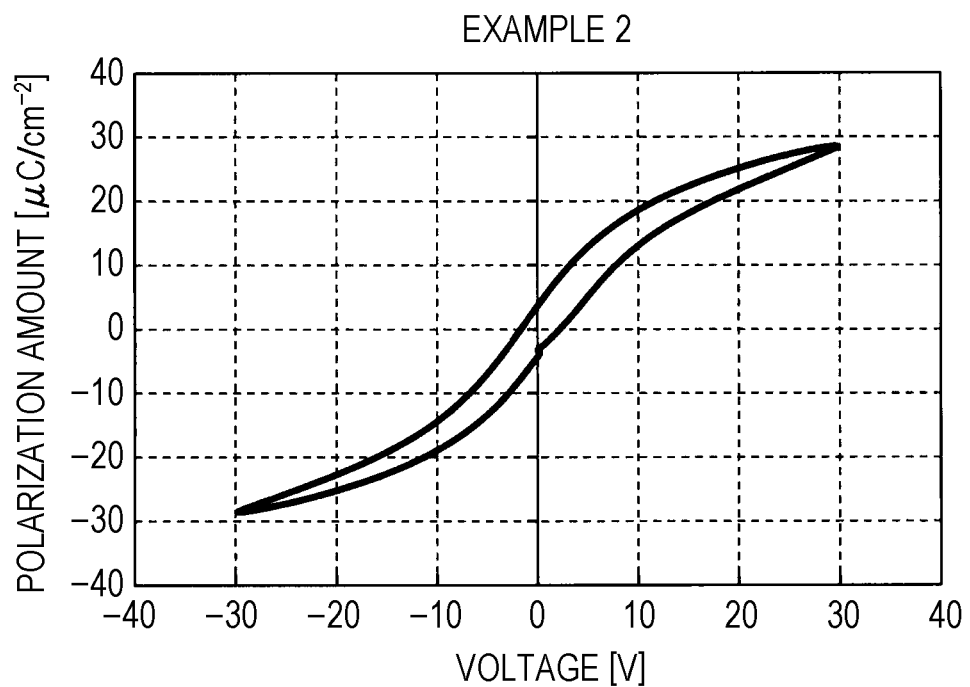
FIG. 13 is a diagram illustrating a hysteresis curve in Example 2.

P-E hysteresis of each of ceramic films in Examples 1 and 2 was measured at a frequency of 1 kHz by using "FCE-1A" (manufactured by TOYO Corporation). FIGS. 12 and 13 show results. A hysteresis curve shows a high insulating property and excellent hysteresis is drawn.

Leakage Current Density Measurement

Leakage current density of a piezoelectric thin film element was measured by using "4140B" (manufactured by Agilent Corporation). Table shows values of leakage current density when an applied electric field is set to be 400 kV/cm.

XRD Measurement

"D8 Discover" manufactured by Bruker AXS Corporation was used.

Measurement was performed at room temperature by using Cu-Kα as a beam source and a two-dimensional detector (GADDS) as a detector.

Table shows the intensity ratio (X/Y) between a peak X having the highest intensity and a peak Y having the lowest intensity among peaks derived from KNN in a range of $44° < 2\theta < 48°$. A case where the piezoelectric layer was preferentially oriented to the (100) plane was set to be A, and a case where the piezoelectric layer was not preferentially oriented to the (100) plane was set to be B.

FIGS. 14 to 17 illustrate examples of XRD and an example of obtaining the intensity ratio, by using Example 1 and Comparative Example 1 as an example.

Figure 14:
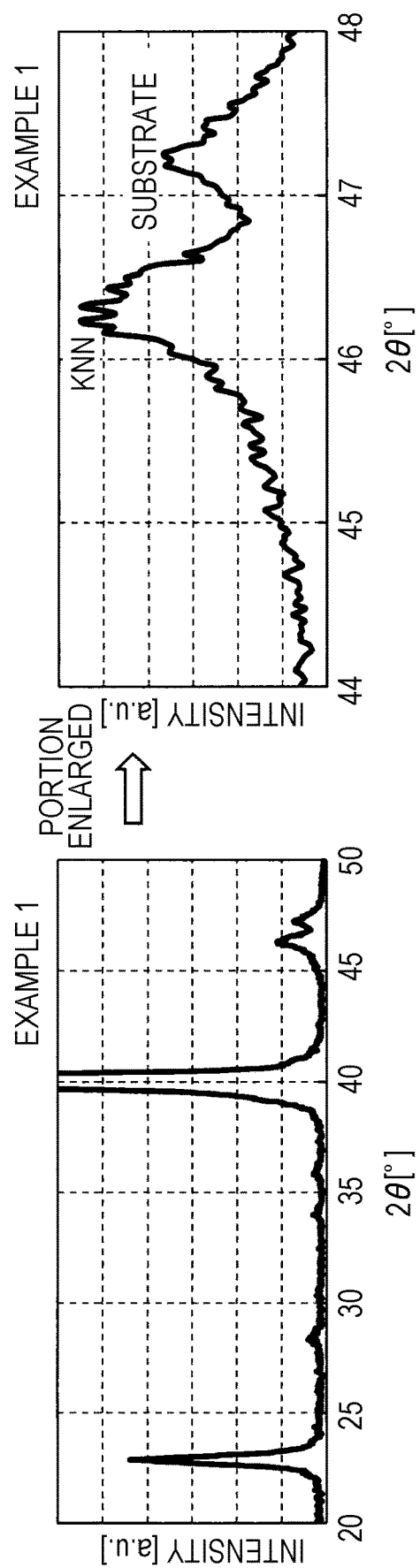
FIG. 14 illustrates XRD and an enlarged portion thereof in Example 1.
Figure 15:
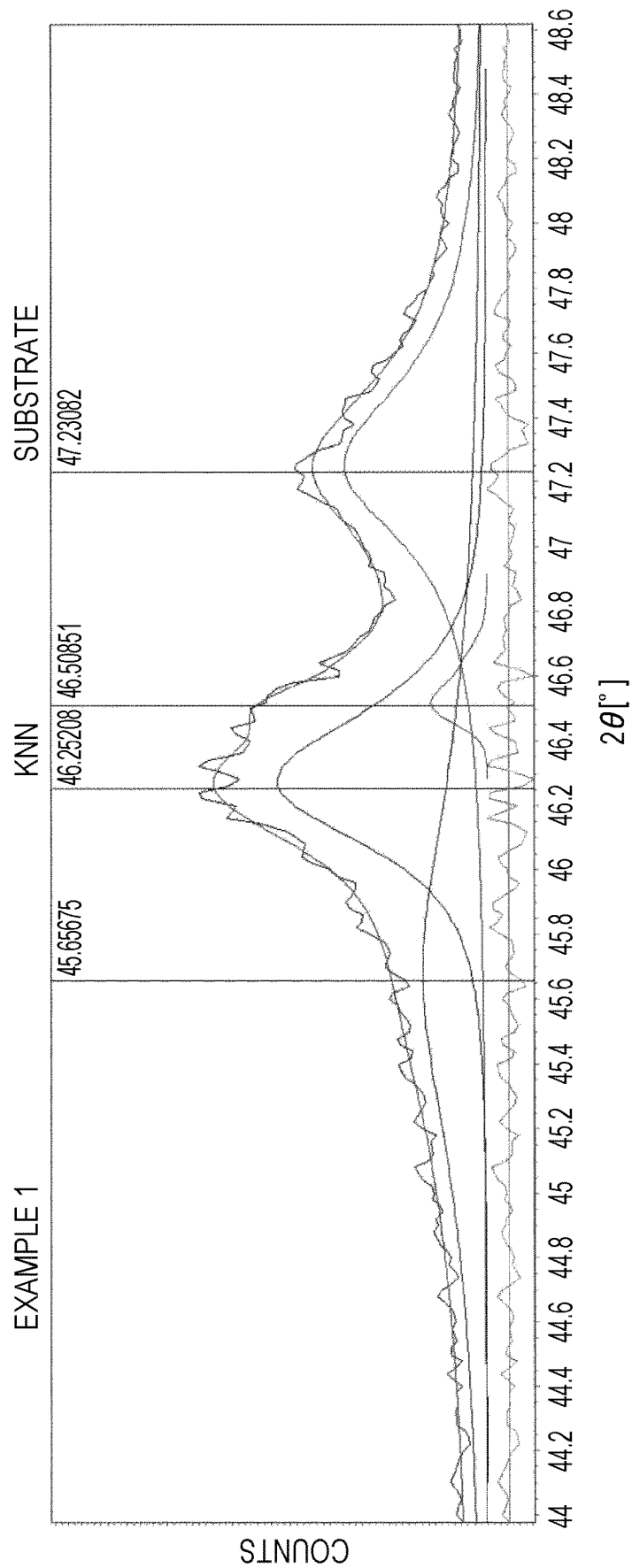
FIG. 15 is a diagram illustrating a state of peak separation in Example 1.

FIG. 14 illustrates XRD and an enlarged portion thereof in Example 1. FIG. 15 illustrates results obtained in a manner that peak separation in a range of $44° < 2\theta < 48°$ is performed by using the Pearson VII function.

In FIG. 15, 3 peaks (in the vicinity of 45.6, 46.2, and 46.5) derived from KNN were provided, and the intensity ratio was 5.2.

Figure 16:
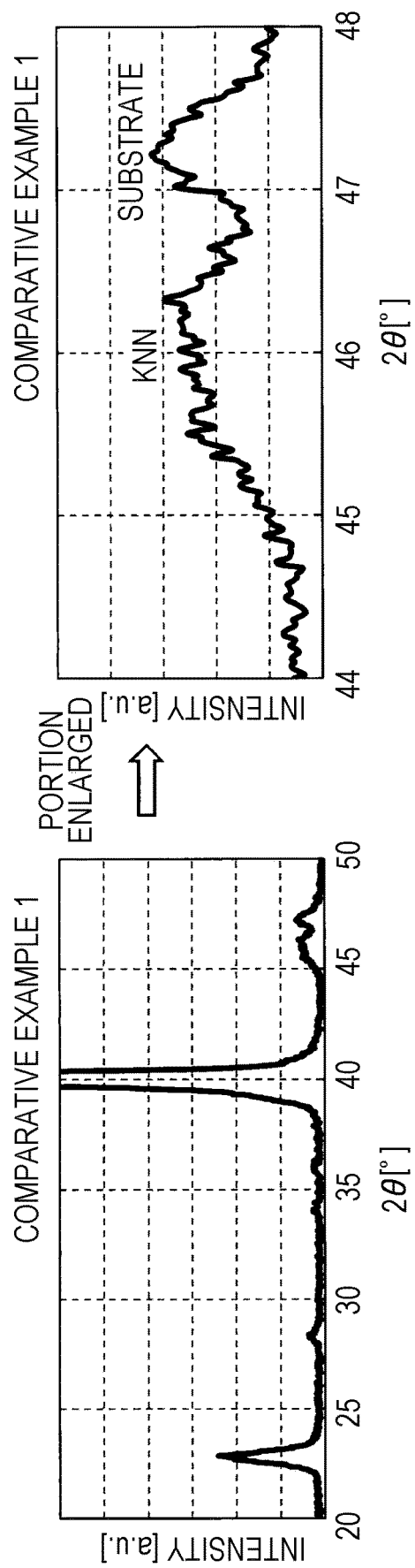
FIG. 16 illustrates XRD and an enlarged portion thereof in Comparative Example 1.
Figure 17:
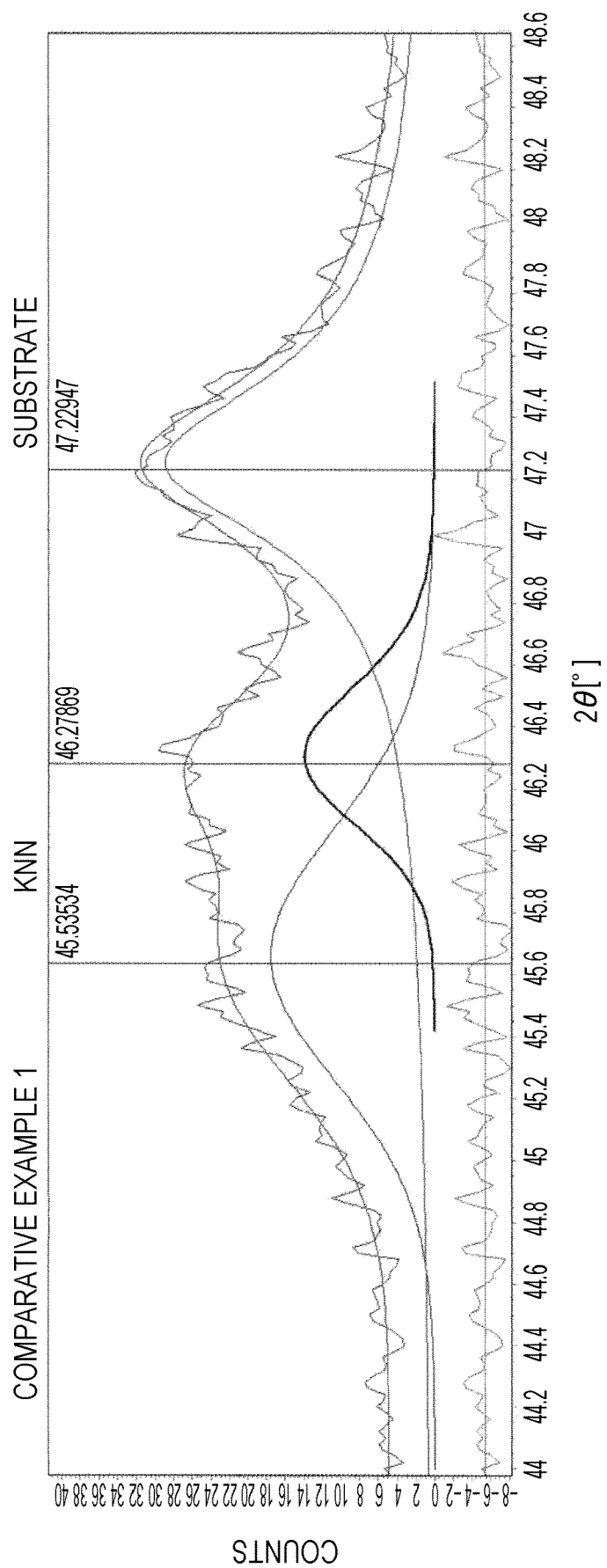
FIG. 17 is a diagram illustrating a state of peak separation in Comparative Example 1.

FIG. 16 illustrates XRD and an enlarged portion thereof in Comparative Example 1. FIG. 17 illustrates results obtained by performing peak separation in a range of $44° < 2\theta < 48°$. In FIG. 17, 2 peaks (in the vicinity of 45.6 and 46.2) derived from KNN were provided, and the intensity ratio was 1.7.

XPS Measurement

Figure 18:
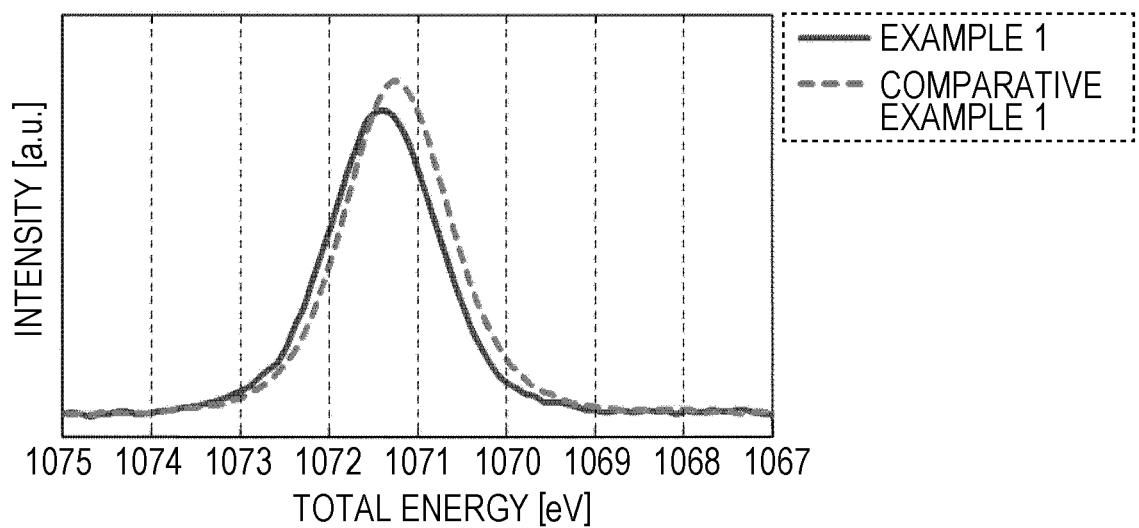
FIG. 18 is a diagram illustrating a Na peak in XPS.
Figure 19:
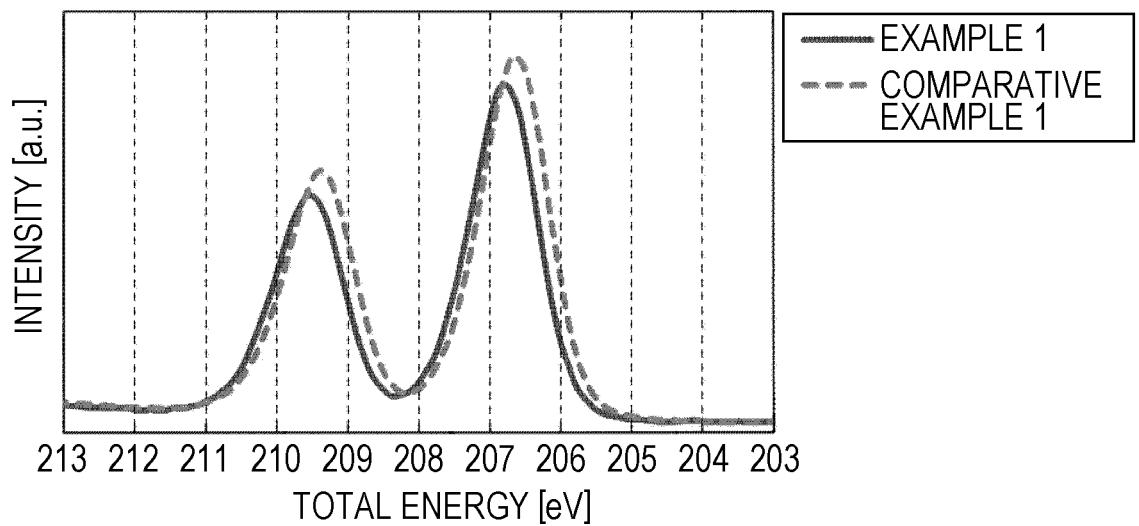
FIG. 19 is a diagram illustrating a Nb peak in XPS.

An X-ray photoelectron spectrometer "ESCALAB250" manufactured by Thermo Fisher Scientific Corporation was used. Measurement was performed by using an Al-Kα beam having a spot diameter of 500 μm², as an X-ray source. The measurement was performed in a state where irradiation by an electron gun was performed in order to correct charging. A survey spectrum was measured at a step interval of 1 eV, pass energy of 200 eV, and a storing time of 100 μs. FIG. 18 illustrates measurement data of sodium, and FIG. 19 illustrates measurement data of niobium.

Table shows results obtained by the above-described measurements.

TABLE

| Sample | XRD Peak intensity (X) of high intensity peak/peak intensity (Y) of low intensity peak | XPS Nb $3d_{3/2}$ peak position | XPS Na 1s peak position | Leakage current density (A/cm²) | Orientation |
| --- | --- | --- | --- | --- | --- |
| Example 1 | 5.2 | 206.8 | 1071.4 | $1.1 \times 10^{-5}$ | A |
| Example 2 | 3.8 | 206.8 | 1071.3 | $8.1 \times 10^{-4}$ | A |
| Comparative Example 1 | 1.6 | 206.6 | 1071.3 | $8.0 \times 10^{-3}$ | A |
| Comparative Example 2 | 1.7 | 206.6 | 1071.4 | $5.2 \times 10^{-5}$ | B |
| Comparative Example 3 | 2 | 206.8 | 1071.7 | Breaking at electric field lower than 400 kV/cm | A |

Test Result

From the results in Table, which were obtained by measuring leakage current density, a difference of about 1 digit in leakage current density was shown and improvement of the insulating property by lacking in the A site could be confirmed, if Example 2 in which lacking in the A site was provided and Mn was added was compared with Comparative Example 1 in which lacking in the A site was not provided and only Mn was added. In a case of Comparative Example 3 in which lacking in the A site was provided, but Mn was not added, it was understood that breaking occurred at a low electric field, in Comparative Example 3. In Comparative Example 2 in which lacking in the A site was not provided and a large amount of Mn was provided, it was understood that the insulating property was high. However, when XRD measurement results were viewed, the followings were understood. That is, random orientation occurred in Comparative Example 2 in which lacking in the A site was not provided and a high insulating property was shown. However, crystals were oriented to the (100) plane in Example 1 in which the insulating property which was equivalent to that in Comparative Example 2 was shown by performing lacking in the A site. From these points, the followings were understood. That is, although the insulating property was improved by containing a large amount of Mn, it was not possible to satisfy a high insulating property and crystal orientation together. However, if lacking in the A site was set in addition to addition of Mn, it was possible to satisfy a high insulating property and crystal orientation together.

With the above descriptions, it was understood that lacking in the A site and addition of Mn were effective in order to obtain a high breakdown voltage and to improve the insulating property in a state where crystals were oriented.

Even though the K/Na ratio varies, if the above conditions are satisfied, it is possible to obtain a high insulating property.

Other Embodiments

Hitherto, the embodiment of the piezoelectric material or the piezoelectric element, and the liquid ejecting unit and the liquid ejecting apparatus which have the piezoelectric element mounted therein, according to the invention is described. However, the basic configuration of the invention is not limited to the above-described form. For example, in Embodiment 1, the silicon substrate as the passage formation substrate 10 is exemplified. However, it is not limited thereto, and may use, for example, a SOI substrate or a material such as glass.

In Embodiment 1, as an example of the liquid ejecting unit, the ink jet recording head is exemplified and described. However, the invention may be widely applied to all types of the liquid ejecting head, and may be applied to a liquid ejecting unit which ejects a liquid other than an ink. Examples of such a liquid ejecting head include various recording heads used in an image recording apparatus such as a printer; a coloring material ejecting head used in manufacturing a color filter in a liquid crystal display and the like; an electrode material ejecting head used in forming an electrode in an organic EL display, a field emission display (FED), and the like; and a bio-organic material ejecting head used in manufacturing a bio-chip.

The invention is not limited to the piezoelectric element mounted in the liquid ejecting head, and may be also applied to a piezoelectric element mounted in other piezoelectric element applied devices. As an example of the piezoelectric element applied device, an ultrasonic device, a motor, a pressure sensor, a pyroelectric element, and a ferroelectric element may be exemplified. A finished article using the piezoelectric element applied device, for example, an ejecting apparatus of a liquid and the like, which uses an ejecting head for the liquid and the like; an ultrasonic sensor using the ultrasonic device; a robot using the motor as a driving source; an IR sensor using the pyroelectric element; a ferroelectric memory using the ferroelectric element may be included as the piezoelectric element applied device.

The thickness, the width, the relative positional relationship, and the like of the constituents illustrated in the drawings, that is, the layers and the like may be exaggeratedly illustrated in describing the invention. The term of "being on" in the specification is not limited to the meaning that the positional relationship between the constituents is "just on". For example, an expression of "the first electrode on the substrate" or "the piezoelectric layer on the first electrode" includes a case where other constituents are provided between the substrate and the first electrode or between the first electrode and the piezoelectric layer.

What is claimed is:

1. A piezoelectric element comprising:
a first electrode;
a second electrode; and
a piezoelectric layer which is provided between the first electrode and the second electrode, and is formed of a perovskite type oxide which contains potassium, sodium, niobium, and manganese,
wherein, in the piezoelectric layer, a proportion of an A-site constituent element of the perovskite type oxide is smaller than a proportion of a B-site constituent element thereof, and
in XRD measurement of the piezoelectric layer, two or more peaks derived from the perovskite type oxide are provided in a range of $44°<2\theta<48°$, and an intensity ratio (X/Y) between a peak X having the highest intensity among the peaks, and a peak Y having the lowest intensity satisfies the following expression $$2.0<(X/Y).$$

2. The piezoelectric element according to claim 1, wherein the perovskite type oxide constituting the piezoelectric layer is represented by the following formula

$$(0.2 \leq x \leq 0.8, 0.9 \leq y < 1, \text{ and } 0.003 \leq z \leq 0.02).$$

3. The piezoelectric element according to claim 1, wherein, in the piezoelectric layer, crystals are oriented to {100} orientation.

4. The piezoelectric element according to claim 1, wherein, when a chemical bonding state of Nb is measured by XPS measurement, a Nb $3d_{3/2}$ peak of Nb>206.6 eV is satisfied.

5. The piezoelectric element according to claim 1, wherein, when a chemical bonding state of Na is measured by XPS measurement, a Na 1s peak of Na<1071.7 eV is satisfied.

6. The piezoelectric element according to claim 1, wherein the first electrode and the second electrode are formed of at least one material selected from Pt, Ir, and oxides thereof.

7. The piezoelectric element according to claim 1, further comprising:
a layer which is formed of zirconium or zirconium oxide and is provided between a substrate on which the first electrode is provided, and the first electrode.

8. A piezoelectric element applied device comprising: the piezoelectric element according to claim 1.

9. A piezoelectric element applied device comprising: the piezoelectric element according to claim 2.

10. A piezoelectric element applied device comprising: the piezoelectric element according to claim 3.

11. A piezoelectric element applied device comprising: the piezoelectric element according to claim 4.

12. A piezoelectric element applied device comprising: the piezoelectric element according to claim 5.

13. A piezoelectric element applied device comprising: the piezoelectric element according to claim 6.

14. A piezoelectric element applied device comprising: the piezoelectric element according to claim 7.

* * * * *